US008633714B2

(12) United States Patent
Shirai (10) Patent No.: US 8,633,714 B2
(45) Date of Patent: Jan. 21, 2014

(54) IMPEDANCE DETECTING CIRCUIT AND IMPEDANCE DETECTION METHOD

(75) Inventor: Hiroaki Shirai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 348 days.

(21) Appl. No.: 13/067,091

(22) Filed: May 6, 2011

(65) Prior Publication Data

US 2011/0285411 A1    Nov. 24, 2011

(30) Foreign Application Priority Data

May 24, 2010    (JP) .................................. 2010-118072

(51) Int. Cl.
*G01R 27/26*    (2006.01)
(52) U.S. Cl.
USPC ........... 324/684; 342/649; 342/658; 342/679; 342/686
(58) Field of Classification Search
USPC ......... 324/649, 658, 669, 672, 679, 683, 684, 324/686, 709, 720
See application file for complete search history.

(56) References Cited

U.S. PATENT DOCUMENTS

| 4,470,008 | A * | 9/1984 | Kato | .................................. | 327/4 |
| 6,194,888 | B1 * | 2/2001 | Matsumoto et al. | .......... | 323/364 |
| 6,331,780 | B1 * | 12/2001 | Hiroshima et al. | ........... | 324/684 |
| 6,335,642 | B1 * | 1/2002 | Hiroshima et al. | ........... | 327/102 |
| 6,348,809 | B1 * | 2/2002 | Hirota et al. | .............. | 324/754.07 |
| 6,856,145 | B2 * | 2/2005 | Pelz et al. | ...................... | 324/663 |
| 7,323,886 | B2 * | 1/2008 | Lee | ............................... | 324/679 |

FOREIGN PATENT DOCUMENTS

| JP | 09280806 A | * 10/1997 | ............... G01B 7/00 |
| JP | 2002-350477 A | 12/2002 | |

* cited by examiner

*Primary Examiner* — Huy Q Phan
*Assistant Examiner* — James Split
(74) *Attorney, Agent, or Firm* — McGinn IP Law Group, PLLC (57) ABSTRACT

An impedance detection circuit includes a detection circuit, a correction circuit, a subtraction circuit, and an AC signal generator. The detection circuit has a first operational amplifier having an inverting input terminal coupled with one end of a signal line to whose other end a measured capacitor Cs is coupled, a non-inverting input terminal coupled with a shielding wire covering at least a part of the signal line and an output terminal of the AC signal generator, and an output terminal, and a second feedback resistor coupled between the output terminal and the inverting input terminal of the first operational amplifier. The correction circuit has a third resistor and a variable capacitor, and corrects a detection signal outputted from the first operational amplifier by adjusting a capacitance of the variable capacitor.

12 Claims, 8 Drawing Sheets

IMPEDANCE DETECTING CIRCUIT AND IMPEDANCE DETECTION METHOD

CROSS-REFERENCE TO RELATED APPLICATION

The disclosure of Japanese Patent Application No. 2010-118072 filed on May 24, 2010 including the specification, drawings and abstract is incorporated herein by reference in its entirety.

BACKGROUND

The present invention relates to an impedance detection circuit and an impedance detection method, and more specifically, to an impedance detection circuit capable of removing an influence of a parasitic capacitor, and an impedance detection method.

In recent years, with sophistication of systems of electronic devices etc., circuits for detecting impedances, such as a capacitance sensor, are being widely used. Therefore, there is desired an impedance detection circuit that is small-sized, easy to be adjusted, and further can detect an impedance correctly without being affected by an outer environment so as to be able to be used being mounted on various places.

Figure 8:
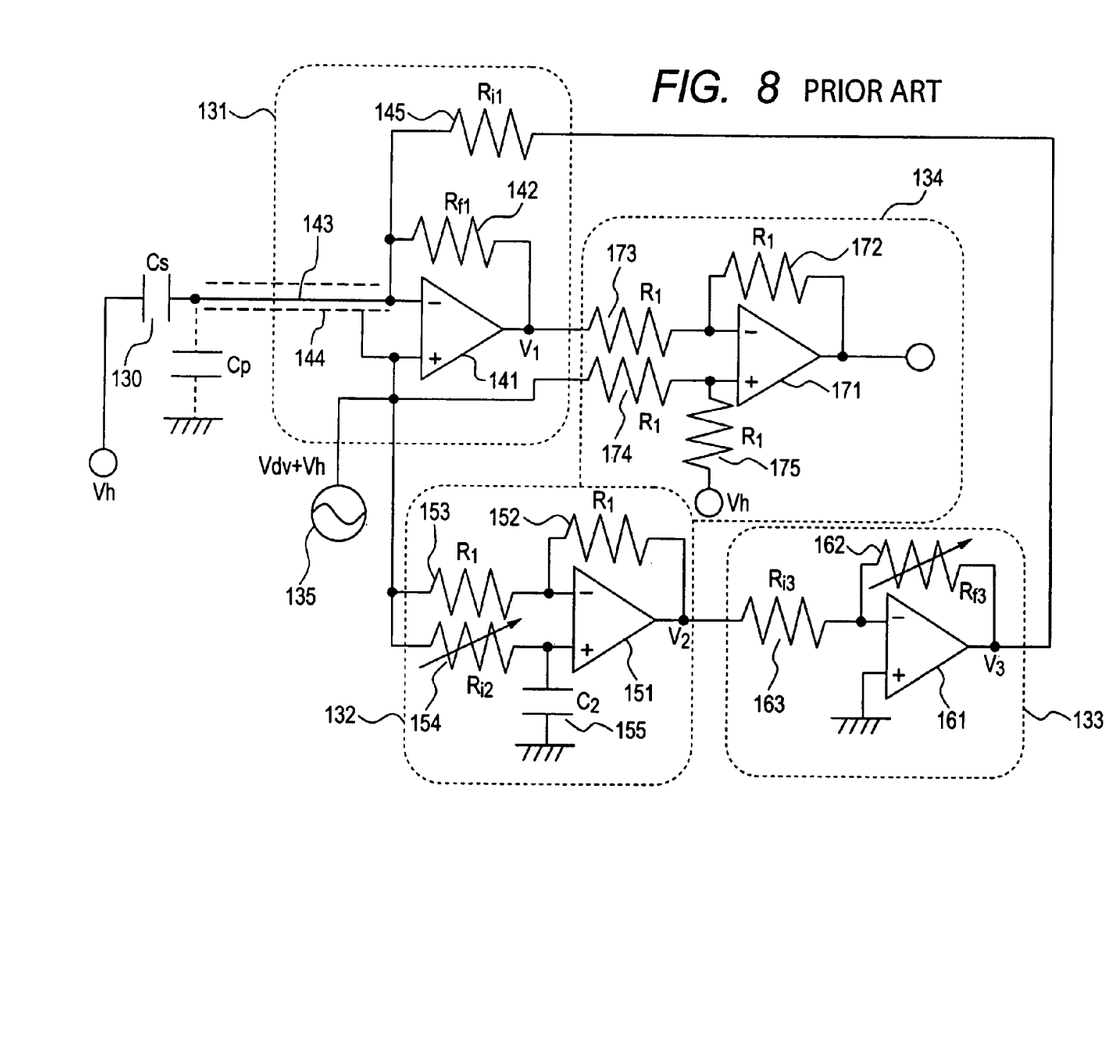
FIG. 8 is a circuit diagram showing an impedance detection circuit disclosed in Japanese Unexamined Patent Application Publication No. 2002-350477.

FIG. 8 is a circuit diagram for explaining the impedance detection circuit disclosed in Japanese Unexamined Patent Application Publication No. 2002-350477. An impedance detection circuit according to Japanese Unexamined Patent Application Publication No. 2002-350477 shown in FIG. 8 operates to convert an unknown electrostatic capacitance Cs of a capacitor 130 to be measured (a measured capacitor 130) to a corresponding voltage (i.e., to a voltage proportional to the Cs). In FIG. 8, the impedance detection circuit is composed of a detection circuit 131, a phase compensating circuit 132, an amplitude compensating circuit 133, a subtraction circuit 134, and an alternating current (AC) signal generator 135.

The detection circuit 131 is a circuit for detecting the capacitance Cs of the measured capacitor 130. The detection circuit 131 has an operational amplifier 141 whose voltage gain is very much larger than its closed loop gain, seemingly almost infinite. A feedback resistor 142 is coupled between an output terminal and an inverting input terminal (−) of the operational amplifier 141, and negative feedback is given to the operational amplifier 141. A driving signal outputted from the AC signal generator 135 is impressed to a non-inverting input terminal (+) of the operational amplifier 141. An other end of a signal line 143 whose one end is coupled with one electrode of the measured capacitor 130 is coupled to the inverting input terminal (−) of the operational amplifier 141. An other electrode of the measured capacitor 130 is grounded, is added a fixed direct current (DC) bias Vh, or is not grounded.

In order to prevent undesired signals, such as noises from the outside, from being induced to the signal line 143, the circumference of the signal line 143 is surrounded by a shielding wire 144. The shielding wire 144 is not grounded but is coupled with the non-inverting input terminal (+) of the operational amplifier 141.

Incidentally, a symbol Cp of FIG. 8 designates the parasitic capacitor produced in a portion where the signal line 143 is not shielded, i.e., a portion where the signal line is exposed, and there is a possibility that a surrounding AC signal is impressed to the inverting input terminal (−) through this.

Since the operational amplifier 141 is given the negative feedback through the feedback resistor 142 and the voltage gain of the operational amplifier 141 is very much larger than a closed loop gain, and is seen almost infinite, both input terminals of the operational amplifier 141 are in an imaginary short state. That is, a potential difference between the inverting input terminal (−) and the non-inverting input terminal (+) of the operational amplifier 141 is substantially zero. Therefore, since the signal line 143 and the shielding wire 144 are the same potential (so-called voltage), a stray capacitance (the parasitic capacitor) produced between the signal line 143 and the shielding wire 144 can be cancelled. This fact holds regardless of the length of the signal line 143 and further regardless of movement, bending, etc. of the signal line 143.

The phase compensating circuit 132 is a circuit for compensating the phase of the driving signal outputted from the AC signal generator 135. The phase compensating circuit 132 includes an operational amplifier 151, and a feedback resistor 152 of resistance R1 is coupled between an output terminal and an inverting input terminal (−) of the operational amplifier 151. The driving signal outputted from the AC signal generator 135 is supplied to the inverting input terminal (−) of the operational amplifier 151 through a resistor 153 of resistance R1. Moreover, this driving signal is also supplied to a non-inverting input terminal (+) of the operational amplifier 151 through a variable resistor 154 of resistance Ri2. This non-inverting input terminal (+) is grounded through a capacitor 155 of capacitance C2.

The amplitude compensating circuit 133 is a circuit for compensating the amplitude of the driving signal from the AC signal generator 135. The amplitude compensating circuit 133 includes an operational amplifier 161, and a feedback resistor 162 of resistance Rf3 is coupled between an output terminal and an inverting input terminal (−) of the operational amplifier 161. An output voltage of the phase compensating circuit 132, i.e., an output voltage V2 of the operational amplifier 151 is impressed to the inverting input terminal (−) of the operational amplifier 161 through a resistor 163 of resistance Ri3, and the non-inverting input terminal (+) is grounded. Further, an output V3 of the operational amplifier 161 is supplied to the inverting input terminal (−) of the operational amplifier 141 through a resistor 145 of resistance Ri1. Additionally, although a current produced by the electrostatic capacitance Cs and a parasitic capacitor Cp flows toward the feedback resistor 142. At this time, the adjusted current is flowing into the feedback resistor 142 from an output terminal of the amplitude compensating circuit 133 through the resistor 145 so as to cancel the current corresponding to the added Cp.

The subtraction circuit 134 is a circuit for subtracting an output of the AC signal generator 135 from an output of the detection circuit 131. The subtraction circuit 134 includes an operational amplifier 171, and a feedback resistor 172 of resistance R1 is coupled between an output terminal and an inverting input terminal (−) of the operational amplifier 171. The output of the detection circuit 131, i.e., an output V1 of the operational amplifier 141 is impressed to the inverting input terminal (−) of the operational amplifier 171 through a resistor 173 of resistance R1; the output of the AC signal generator 135 is impressed to the non-inverting input terminal (+) through a resistor 174 of resistance R1. A DC bias Vh is impressed to this non-inverting input terminal (+) through a resistor 175 of resistance R1.

Although the driving signal outputted from the AC signal generator 135 is a sum of an AC signal Vdv and the DC bias Vh, the DC bias Vh may be zero. Below, an operation of the impedance detection circuit shown in FIG. 8 will be explained. The signal line 143 that couples the inverting input terminal (−) of the operational amplifier 141 of the detection circuit 131 and the one of electrodes forming the measured capacitor 130 is surrounded and shielded by the shielding wire 144. However, even when the measured capacitor 130 is not coupled, an output of this impedance detection circuit, i.e., an output signal Vout of the operational amplifier 171 is shifted from the phase of the AC signal Vdv although it is small. This is because the parasitic capacitor Cp produced in a portion where the signal line 143 is not shielded remains.

Therefore, in order to cancel such a phase shift, after adjusting the phase and amplitude of the AC signal Vdv with the phase compensating circuit 132 and the amplitude compensating circuit 133, respectively, the signal after the adjustment, i.e., the output V3 of the operational amplifier 161 is fed back to the inverting input terminal of the operational amplifier 141 of the detection circuit 131 through the resistor 145.

In this case, denoting an angular frequency of the AC signal Vdv by ω, an output V2 of the phase compensating circuit 132 is expressed as follows.

[Equation 1]

$$V_2 = \frac{1 - j\omega C_2 R_{i2}}{1 + j\omega C_2 R_{i2}} V_{dV} + V_h \quad (1)$$

The output V3 of the amplitude compensating circuit 133 is expressed as follows.

[Equation 2]

$$V_3 = -\frac{R_{f3}}{R_{i3}} \frac{1 - j\omega C_2 R_{i2}}{1 + j\omega C_2 R_{i2}} (V_{dV} + V_h) \quad (2)$$

The output V1 of the detection circuit 131 is expressed as follows.

[Equation 3]

$$V_1 = j\omega C_s R_{f1} V_{dV} + j\omega C_p R_{f1}(V_{dV} + V_h) + \left\{1 + \frac{R_{f1}}{R_{i1}} + \frac{R_{f1}}{R_{i1}} \frac{R_{f3}}{R_{i3}} \frac{1 - j\omega C_2 R_{i2}}{1 + j\omega C_2 R_{i2}}\right\}(V_{dv} + V_h) \quad (3)$$

The output signal Vout of the subtraction circuit 134 is expressed as follows.

[Equation 4]

$$V_{out} = -j\omega C_s R_{f1} V_{dv} - j\omega C_p R_{f1}(V_{dv} + V_h) - \frac{R_{f1}}{R_{i1}}\left\{1 + \frac{R_{f3}}{R_{i3}} \frac{1 - j\omega C_2 R_{i2}}{1 + j\omega C_2 R_{i2}}\right\}(V_{dv} + V_h) + V_h$$
$$= -j\omega C_s R_{f1} V_{dv} - (P + Qj)V_{dv} - (P - 1 + Qj)V_h. \quad (4)$$

Here, P and Q are as follow.

[Equation 5]

$$P = \frac{R_{f1}}{R_{i1}} + \frac{R_{f1}}{R_{i1}} \frac{R_{f3}}{R_{i3}} \frac{1 - \omega^2 C_2^2 R_{i2}^2}{1 + \omega^2 C_2^2 R_{i2}^2} \quad (5)$$

[Equation 6]

$$Q = \omega C_p R_{f1} - \frac{R_{f1}}{R_{i1}} \frac{R_{f3}}{R_{i3}} \frac{2\omega C_2 R_{i2}}{1 + \omega^2 C_2^2 R_{i2}^2} \quad (6)$$

Therefore, it is possible to realize conditions of P=0 and Q=0 by adjusting the resistance Ri2 of the resistor 154, and the resistance Ri3 of the resistor 163 depending on the parasitic capacitor Cp. In measuring the electrostatic capacitance Cs of the measured capacitor 130, an adjustment of these resistances Ri2 and Ri3 is performed before coupling the measured capacitor 130. Under this condition, the resistance Ri2 of the resistor 154 and the resistance Ri3 of the resistor 163 are adjusted so as to fulfill the following equation.

[Equation 7]

$$R_{i2} = \frac{1 + \sqrt{1 + \omega^2 C_p^2 R_{i3}^2}}{\omega^2 C_2 C_p R_{i3}} \quad (7)$$

[Equation 8]

$$R_{f3} = R_{i3} \sqrt{1 + \omega^2 C_p^2 R_{i1}^2} \quad (8)$$

As a result, the output signal Vout of the subtraction circuit 134 becomes as follows.

[Equation 9]

$$V_{out} = j\omega C_s R_{f1} V_{dV} + V_h \quad (9)$$

This equation (9) indicates that the amplitude of the output signal Vout of the subtraction circuit 134 is proportional to the electrostatic capacitance Cs of the measured capacitor 130 without being affected by the parasitic capacitor Cp.

As explained above, in the impedance detection circuit shown in FIG. 8, adjusting the values of the two variable resistors enables to obtain an output signal having a value proportional to the electrostatic capacitance Cs of the measured capacitor 130 without being affected by the parasitic capacitor Cp.

SUMMARY

In the impedance detection circuit disclosed in Japanese Unexamined Patent Application Publication No. 2002-350477 shown in FIG. 8, due to an influence of a parasitic capacitor, a phase of the signal inputted into the inverting input terminal of an operational amplifier 141 of a detection circuit 131 is delayed with respect to an original signal inputted into the non-inverting input terminal of the operational amplifier 141. For this reason, in the impedance detection circuit shown in FIG. 8, the phase and amplitude of the original signal inputted into the non-inverting input terminal are adjusted using a phase compensating circuit 132 and an amplitude compensating circuit 133. That is, by feeding back a signal (an output signal of the operational amplifier 161) after being adjusted with the use of the phase compensating circuit 132 and the amplitude compensating circuit 133 to the inverting input terminal of the operational amplifier 141 of the detection circuit 131, a phase delay is cancelled and an influence of the parasitic capacitor is removed.

At this time, in the impedance detection circuit shown in FIG. 8, it is necessary to adjust two of a variable resistor 154 of the phase compensating circuit 132 and a variable resistor 162 of the amplitude compensating circuit 133, and there is a problem that the adjustment becomes complicated.

The impedance detection circuit according to an aspect of the present invention has: an AC signal generator for generating an AC signal; a detection circuit that has a first operational amplifier having an inverting input terminal coupled with one end of a signal line to whose other end a measured capacitor is coupled, a non-inverting input terminal coupled with a shielding wire covering at least a part of the signal line and an output terminal of the AC signal generator, and an output terminal, and a first feedback resistor coupled between the output terminal and the inverting input terminal of the first operational amplifier; a correction circuit that has a first resistor whose one end is coupled with the output terminal of the first operational amplifier and whose other end is coupled with a first node, a variable capacitor whose one end is electrically coupled with the first node, corrects a detection signal outputted from the first operational amplifier by adjusting a capacitance of the variable capacitor, and outputs the detection signal after the correction from the first node; and a subtraction circuit for subtracting a signal inputted into the inverting input terminal of the first operational amplifier from the detection signal after the correction outputted from the correction circuit.

The impedance detection circuit according to the aspect of the present invention has the correction circuit having the first resistance and the variable capacitor, and can correct the detection signal outputted from the first operational amplifier by adjusting only the variable capacitor of this correction circuit. Therefore, since the influence of the parasitic capacitor can be removed by adjusting only the variable capacitor of the correction circuit, adjustment of the impedance detection circuit becomes easy.

According to another aspect of the present invention, there is provided an impedance detection method for detecting an impedance of the measured capacitor using the impedance detection circuit that has: the AC signal generator for generating a AC signal; the detection circuit that has the first operational amplifier having the inverting input terminal coupled to the one end of the signal line to whose other end the measured capacitor is coupled, the non-inverting input terminal coupled with the shielding wire covering at least a part of the signal line and the output terminal of the AC signal generator, and the output terminal, and the first feedback resistor coupled between the output terminal and the inverting input terminal of the first operational amplifier; the correction circuit that has the first resistor whose one end is coupled with the output terminal of the first operational amplifier and whose other end is coupled with the first node and the variable capacitor whose one end is electrically coupled with the first node and outputs the detection signal after the correction from the first node; and a subtraction circuit for subtracting a signal inputted into the inverting terminal of the first operational amplifier from the detection signal after the correction outputted from the correction circuit; wherein a phase of the detection signal outputted from the first operational amplifier is delayed and an amplitude of the detection signal is attenuated by adjusting the capacitance of the variable capacitor of the correction circuit.

According to the aspect of the present invention, the impedance detection method can correct the detection signal outputted from the first operational amplifier by adjusting only the variable capacitor of the correction circuit having the first resistor and the variable capacitor. Therefore, since it is possible to remove the influence of the parasitic capacitor by adjusting only the variable capacitor of the correction circuit, adjustment of the impedance detection circuit becomes easy.

According to the present invention, it is possible to provide an impedance detection circuit capable of removing the influence of the parasitic capacitor by a simple adjustment, and an impedance detection method.

DETAILED DESCRIPTION

First Embodiment

Figure 1:
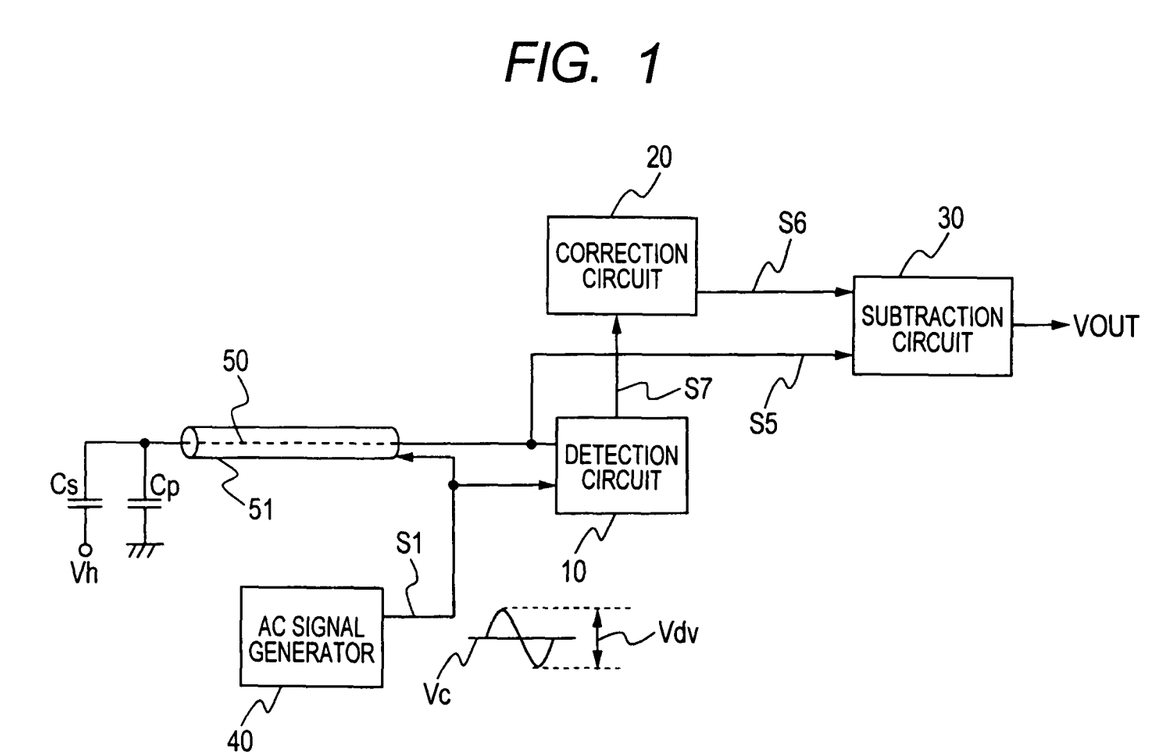
FIG. 1 is a block diagram showing an impedance detection circuit according to a first embodiment.
Figure 2:
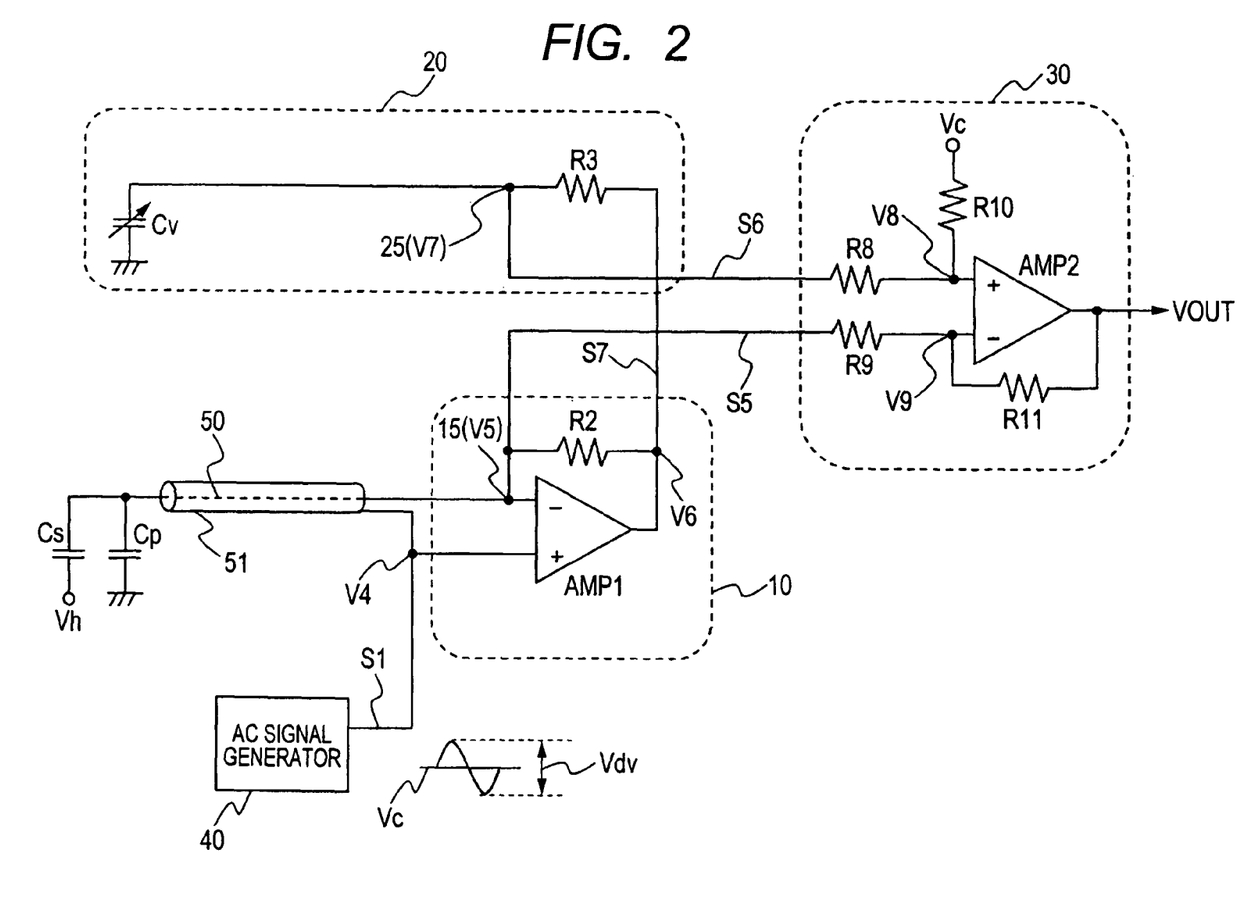
FIG. 2 is a circuit diagram showing the impedance detection circuit according to the first embodiment.

Below, an embodiment of the present invention will be described with reference to drawings. FIG. 1 is a block diagram showing an impedance detection circuit (impedance-voltage conversion circuit) according to this embodiment. The impedance detection circuit according to this embodiment is a circuit capable of obtaining a voltage proportional to a value of an impedance as an output signal Vout. The impedance detection circuit shown in FIG. 1 has a detection circuit 10, a correction circuit 20, a subtraction circuit 30, and an AC signal generator 40. Moreover, FIG. 2 is a circuit diagram showing a concrete configuration of the impedance detection circuit according to this embodiment. Hereafter, components of the impedance detection circuit will be explained in detail using FIG. 1 and FIG. 2.

The AC signal generator 40 generates and outputs a sinusoidal signal S1 that is an AC signal. The sinusoidal signal S1 outputted from the AC signal generator 40 is a synthetic signal of an AC signal component Vdv and a midpoint potential Vc of an AC signal amplitude.

The detection circuit 10 includes an operational amplifier AMP1 (a first operational amplifier) having an inverting input terminal (−), a non-inverting input terminal (+), and an output terminal, and a feedback resistor R2 (a first feedback resistor). The feedback resistor R2 is coupled between the output terminal and the inverting input terminal (−) of the operational amplifier AMP1. Then, a measured capacitor Cs is coupled to the inverting input terminal (−) of the operational amplifier AMP1 through a signal line 50. Moreover, a non-inverting input terminal (+) of the operational amplifier AMP1 is coupled to an output terminal of the AC signal generator 40, and the sinusoidal signal S1 is supplied to the non-inverting input terminal (+).

One electrode of the measured capacitor Cs is coupled to the signal line 50, and an other electrode thereof is coupled to a DC bias potential Vh. Here, the DC bias potential Vh is an earth potential, a specific DC voltage, or a voltage at a Hi-Z state. At least a part of the signal line 50 is covered with a shielding wire 51 in order to prevent an influence of noises from the outside. The shielding wire 51 is coupled to the output terminal of the AC signal generator 40 and the non-inverting input terminal (+) of the operational amplifier AMP1.

Both terminals of the inverting input terminal (−) and the non-inverting input terminal (+) of the operational amplifier AMP1 are in an imaginary short state. Therefore, a potential difference between the inverting input terminal (−) and the non-inverting input terminal (+) of the operational amplifier AMP1 becomes substantially zero, and a signal corresponding to the sinusoidal signal S1 from the AC signal generator 40 flows also in the signal line 50. At this time, if the shielding wire 51 is biased to the DC potential, a parasitic capacitor will be produced between the signal line 50 and the shielding wire 51. However, in this embodiment, since the shielding wire 51 is also coupled to the output terminal of the AC signal generator 40 and the sinusoidal signal S1 is supplied to the shielding wire 51, no parasitic capacitor is generated between the signal line 50 and the shielding wire 51.

Normally, as the signal line 50 becomes long, the capacitance that is parasitic on the signal line 50 also becomes large. However, as in this embodiment, in the case where the signal line 50 is covered with the shielding wire 51, since no parasitic capacitor is generated between the signal line 50 and the shielding wire 51 because of the above-mentioned reason, the parasitic capacitor resulting from the length of the signal line 50 can be disregarded. On the other hand, there is a portion where the shielding wire 51 is not provided in a part of the signal line 50. A parasitic capacitor Cp is produced in this portion where the signal line 50 is exposed.

The correction circuit 20 is a circuit for removing an influence of the parasitic capacitor Cp from the capacitance detected by the detection circuit 10. The correction circuit 20 contains a resistor R3 (a first resistor) and a variable capacitor Cv. One end of the resistor R3 is coupled with an output terminal of the operational amplifier AMP1, and an other end thereof is coupled with a node 25 (a first node). One end of the variable capacitor Cv is coupled with the node 25, and an other end thereof is coupled to the earth potential. That is, the correction circuit 20 inputs therein a detection signal S7 outputted from the operational amplifier AMP1 of the detection circuit 10 at the one end of the resistor R3. Moreover, the correction circuit 20 outputs a detection signal S6 after correction from the node 25 to which an other end of the resistor R3 and one end of the variable capacitor Cv are coupled.

The subtraction circuit 30 outputs the output signal VOUT obtained by subtracting the signal that is inputted into the inverting input terminal (−) of the operational amplifier AMP1 of the detection circuit 10 from the detection signal S6 after the correction that is outputted from the correction circuit 20.

As shown in FIG. 2, the subtraction circuit 30 is composed, for example, including an operational amplifier AMP2 (a fourth operational amplifier) and four resistors R8 to R11. Between the output terminal and the inverting input terminal (−) of the operational amplifier AMP2, the feedback resistor R11 (a second feedback resistor) is coupled. Moreover, the detection signal S6 after the correction that is the output signal from the correction circuit 20 is supplied to a non-inverting input terminal (+) of the operational amplifier AMP2 through the resistor R8 (a sixth resistor). A negative feedback detection signal S5 that is an output signal from the detection circuit 10 is supplied to the inverting input terminal (−) of the operational amplifier AMP2 through a resistor R9 (a seventh resistor). Moreover, a resistor R10 (an eighth resistor) is coupled between the non-inverting input terminal (+) of the operational amplifier AMP2 and a potential same as the midpoint potential Vc of the AC signal amplitude. Incidentally, the sinusoidal signal S1 may be supplied to the subtraction circuit 30 instead of supplying the negative feedback detection signal S5 that is an input signal.

Next, an operation of the impedance detection circuit according to this embodiment will be explained.

The AC signal generator 40 generates and outputs the sinusoidal signal S1 that is an AC signal. The sinusoidal signal S1 outputted from the AC signal generator 40 is the synthetic signal of the AC signal component Vdv and the midpoint potential Vc of the AC signal amplitude. That is, the sinusoidal signal S1 is a signal whose AC signal component Vdv is vibrating on a DC voltage level of the midpoint potential Vc of the AC signal amplitude as a center. The impedance detection circuit according to this embodiment is incapable of detecting the capacitance because charging and discharge currents do not flow in the measured capacitor Cs at the DC voltage level. Therefore, what should be done regarding the sinusoidal signal S1 is just to consider only the AC signal component Vdv. Below, the operation of the impedance detection circuit will be explained denoting an angular frequency of the AC signal Vdv by ω.

Incidentally, node potentials V4 to V9 are shown in FIG. 2. The node potential V4 indicates a potential of the non-inverting input terminal (+) of the operational amplifier AMP1 of the detection circuit 10. A node potential V5 indicates a potential of a node 15, i.e., a potential of the inverting input terminal (−) of the operational amplifier AMP1. A node potential V6 indicates a potential of the output terminal of the operational amplifier AMP1. A node potential V7 indicates a potential of the node 25, i.e., a potential of a coupling point of the resistor R3 and the variable capacitor Cv of the correction circuit 20. A node potential V8 indicates a potential of the non-inverting input terminal (+) of the operational amplifier AMP2 of the subtraction circuit 30. A node potential V9 indicates a potential of the inverting input terminal (−) of the operational amplifier AMP2.

Figure 3:
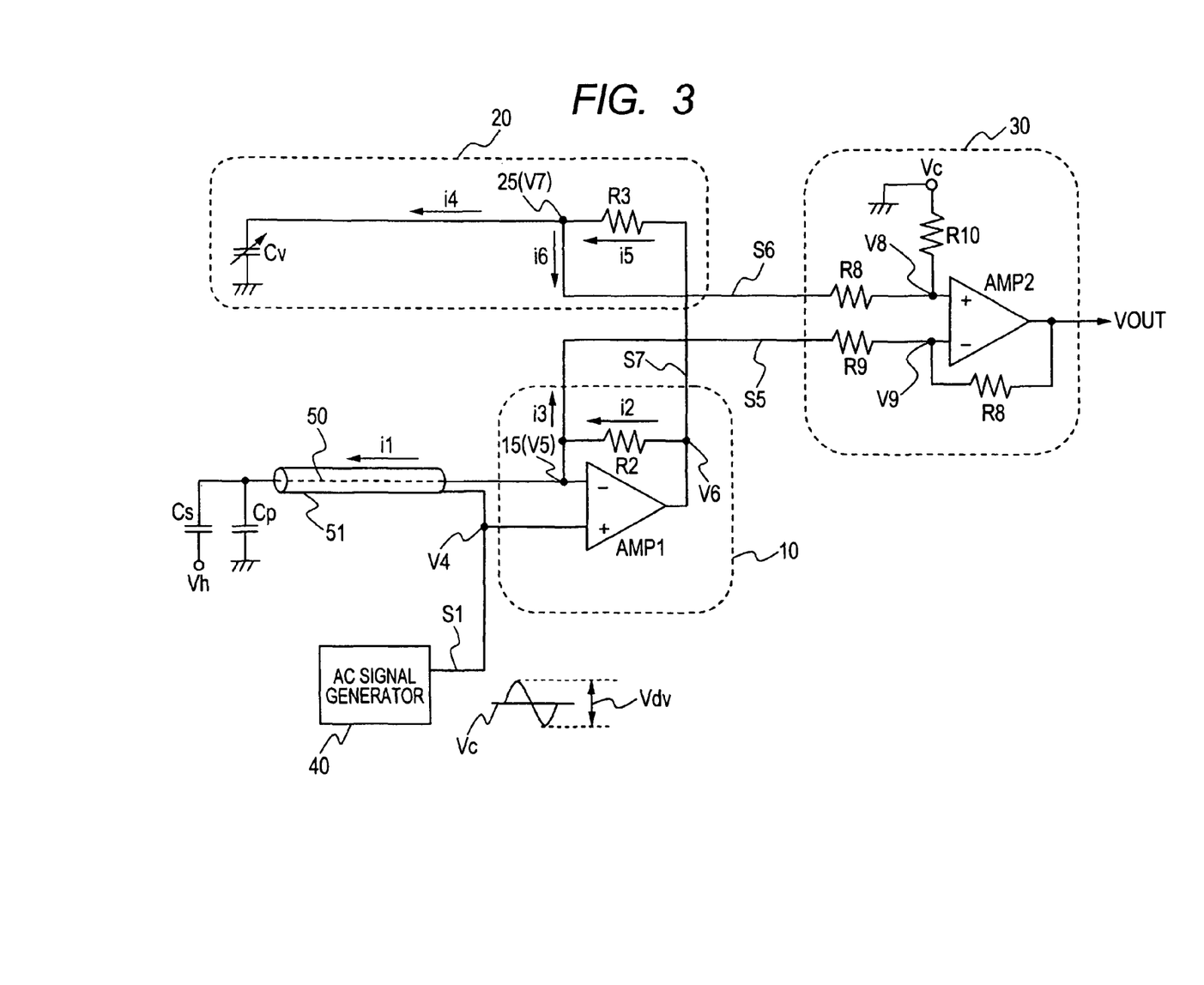
FIG. 3 is a circuit diagram showing the impedance detection circuit according to the first embodiment.

FIG. 3 is a circuit diagram for explaining the operation of the impedance detection circuit according to this embodiment. A point in which FIG. 3 differs from FIG. 2 is that flows of currents i1 to i6 are appended in the circuit diagram of FIG. 3, all the resistors R8 to R11 of the subtraction circuit 30 are replaced by the resistors R8 each having the same resistance, and the midpoint potential Vc of the AC signal amplitude is equalized to the earth potential. Below, the operation of the impedance detection circuit according to this embodiment will be explained using FIG. 3. Here, let the DC bias potential Vh of the measured capacitor Cs be the earth potential.

In the detection circuit 10 of the impedance detection circuit shown in FIG. 3, since the output terminal and the inverting input terminal (−) of the operational amplifier AMP2 form a closed loop altogether through the feedback resistor R2, being closed therein, the inverting input terminal (−) and the non-inverting input terminal (+) of the operational amplifier AMP2 are in an imaginary short state. Therefore, the potential difference between the inverting input terminal (−) and the non-inverting input terminal (+) of the operational amplifier AMP1 becomes substantially zero, and the signal corresponding to the sinusoidal signal S1 from the AC signal generator 40 flows also in the signal line 50. Therefore, the AC signal component Vdv will be impressed to the measured capacitor Cs and the parasitic capacitor Cp. Denoting a synthetic impedance of the measured capacitor Cs and the parasitic capacitor Cp by Rsp and denoting a current consumed by the measured capacitor Cs and the parasitic capacitor Cp by the current i1, the node potential V5 is expressed by the following equation (10).

[Equation 10]

$$V5 = i1 \cdot Rsp \quad (10)$$

Since potentials of both ends of the feedback resistor R2 are the node potential V6 and the node potential V5, respectively, denoting a current flowing in the feedback resistor R2 by a current i2, the following equation (11) is derived from Ohm's law.

[Equation 11]

$$V6-V5=i2 \cdot R2 \qquad (11)$$

Denoting an impedance of the variable capacitor Cv of the correction circuit 20 by Rv, and denoting a current consumed by the variable capacitor Cv by a current i4, the node potential V7 is expressed by the following equation (12).

[Equation 12]

$$V7=i4 \cdot Rv \qquad (12)$$

Since potentials of both ends of the resistor R3 are the node potential V6 and the node potential V7, denoting a current flowing in the resistor R3 by a current i5, a relationship of the both potentials is expressed by the following equation (13) from Ohm's law.

[Equation 13]

$$V6-V7=i5 \cdot R3 \qquad (13)$$

Denoting a current flowing in the two resistors R8 existing between the midpoint potential Vc terminal of the AC signal amplitude of the subtraction circuit 30 and the node 25 (the node potential V7) of the correction circuit 20 by i6, since the midpoint potential Vc terminal of the AC signal amplitude is the earth potential, the node potential V7 is expressed by the following equation (14).

[Equation 14]

$$V7=2 \cdot i6 \cdot R8 \qquad (14)$$

Denoting a current that flows in the two resistors R8 existing between the output terminal (VOUT) of the operational amplifier AMP2 of the subtraction circuit 30 and the node 15 (the node potential V5) of the detection circuit 10 by i3, a potential difference between the node potential V5 and the output signal (detection signal) VOUT is expressed by the following equation (15) from Ohm's law.

[Equation 15]

$$V5-VOUT=2 \cdot i3 \cdot R8 \qquad (15)$$

Then, applying Kirchhoff's first law to the node 15 of the detection circuit 10 and the node 25 of the correction circuit 20, respectively, a relational expression of the following equation (16) is realized at the node 15 and a relational expression of the following equation (17) is realized at the node 25.

[Equation 16]

$$i2=i1+i3 \qquad (16)$$

[Equation 17]

$$i5=i4+i6 \qquad (17)$$

The node potential V8 of the non-inverting input terminal (+) of the operational amplifier AMP2 of the subtraction circuit 30 is expressed by the following equation (18).

[Equation 18]

$$V8=i6 \cdot R8 \qquad (18)$$

The node potential V9 of the inverting input terminal (−) of the operational amplifier AMP2 of the subtraction circuit 30 is expressed by the following equation (19).

[Equation 19]

$$V9=V5-i3 \cdot R8 \qquad (19)$$

Moreover, since the output terminal and the inverting input terminal (−) of the operational amplifier AMP2 form a closed loop altogether through the feedback resistor R8, being closed therein, the inverting input terminal (−) and the non-inverting input terminal (+) of the operational amplifier AMP2 are in an imaginary short state. Accordingly, a potential difference between the inverting input terminal (−) and the non-inverting input terminal (+) of the operational amplifier AMP2 is substantially zero. Therefore, since the node potential V8 and the node potential V9 are equal, a relationship of the following equation (20) is realized.

[Equation 20]

$$i6 \cdot R8=V5-i3 \cdot R8 \qquad (20)$$

By substituting Equation (12) and Equation (14) into Equation (17), the following equation (21) is realized.

[Equation 21]

$$i5 = \frac{V7}{Rv} + \frac{V7}{2 \cdot R8} \qquad (21)$$

By substituting Equation (11) and Equation (21) into Equation (13), the following equation (22) is realized.

[Equation 22]

$$i2 \cdot R2 + V5 - V7 = \left(\frac{V7}{Rv} + \frac{V7}{2 \cdot R8}\right) \cdot R3 \qquad (22)$$

From Equation (14) and Equation (20), the current i3 can be expressed as the following equation (23).

[Equation 23]

$$i3 = \frac{V5}{R8} - \frac{V7}{2 \cdot R8} \qquad (23)$$

By substituting Equation (10) and Equation (23) into Equation (16), the following equation (24) is realized.

[Equation 24]

$$i2 = \frac{V5}{Rsp} + \frac{V5}{R8} - \frac{V7}{2 \cdot R8} \qquad (24)$$

Substituting Equation (24) into Equation (22) and deriving the node potential V7, it is expressed by the following equation (25).

[Equation 25]

$$V7 = \frac{\left(\frac{R2}{Rsp} + \frac{R2}{R8} + 1\right) \cdot V5}{\left(\frac{R3}{Rv} + \frac{R2+R3}{2 \cdot R8} + 1\right)} \qquad (25)$$

Since the output signal Vout of the subtraction circuit 30 is a signal obtained by subtracting the node potential V5 from the node potential V7, the output signal Vout is expressed by the following equation (26).

[Equation 26]

$$VOUT = \frac{\left(\frac{R2}{Rsp} + \frac{R2-R3}{2\cdot R8} - \frac{R3}{Rv}\right) \cdot V5}{\left(\frac{R3}{Rv} + \frac{R2}{2\cdot R8} + 1\right)} \quad (26)$$

Denoting angular frequency of the AC signal Vdv by ω, the synthetic impedance Rsp of the measured capacitor Cs and the parasitic capacitor Cp is expressed by the following equation (27).

[Equation 27]

$$Rsp = \frac{1}{j\omega Cp + j\omega Cs} \quad (27)$$

Moreover, the impedance Rv of the variable capacitor Cv is expressed by the following equation (28).

[Equation 28]

$$Rv = \frac{1}{j\omega Cv} \quad (28)$$

The sinusoidal signal S1, i.e., the AC signal Vdv is outputted from the AC signal generator 40, and is supplied to the non-inverting input terminal (+) of the operational amplifier AMP1 of the detection circuit 10. Since the output terminal and the inverting input terminal (−) of the operational amplifier AMP1 form a closed loop altogether through the feedback resistor R2, being closed therein, the inverting input terminal (−) and the non-inverting input terminal (+) of the operational amplifier AMP2 are in an imaginary short state. Accordingly, the AC signal Vdv is impressed also to the node 15 (the node potential V5), and then the node potential V5 becomes equal to the AC signal Vdv. Therefore, by replacing the node potential V5 of Equation (26) with the AC signal Vdv, and further, by substituting Equation (27) and Equation (28) into Equation (26), the output signal Vout becomes as the following equation (29).

[Equation 29]

$$VOUT = \frac{\left(j\omega \cdot (CsR2 + CpR2 - CvR3) + \frac{R2-R3}{2\cdot R8}\right) \cdot Vdv}{1 + j\omega CvR3 + \frac{R2+R3}{2\cdot R8}} \quad (29)$$

Moreover, if the feedback resistor R2 and the resistor R3 of the detection circuit 10 are set to the same value and the variable capacitor Cv is adjusted to the same value as the parasitic capacitor Cp, the output signal Vout will become as the following equation (30).

[Equation 30]

$$VOUT = \frac{(j\omega CsR2) \cdot Vdv}{1 + j\omega CpR2 + \frac{R2}{R8}} \quad (30)$$

In Equation (30), since a term containing the parasitic capacitor Cp is included in its denominator, the output signal Vout is affected by the influence of the parasitic capacitor Cp. However, since when the capacitance of the measured capacitor Cs is large, the output signal Vout is proportional to the measured capacitor Cs, the impedance detection circuit according to this embodiment acts as an impedance detection circuit capable of obtaining a voltage proportional to the capacitance of the measured capacitor that is the object of the present invention.

In using the impedance detection circuit according to this embodiment, the detection circuit 10 gets operated first in a state where the measured capacitor Cs is not coupled to the signal line 50, i.e., in a state where the impedance detection circuit is affected only by the influence of the parasitic capacitor Cp. Then, in this state, the variable capacitor Cv of the correction circuit 20 is adjusted to equalize a potential of the node 25 (the node potential V7) and a potential of the node 15 (the node potential V5). It can be determined by monitoring the output signal Vout of the subtraction circuit 30 whether the node potential V7 and the node potential V5 are equal.

That is, if a signal that does not contain the AC signal component, i.e., the midpoint potential Vc of the AC signal amplitude that is a DC voltage level is outputted as the output signal Vout, it can be determined that the node potential V7 and the node potential V5 are equal. Thus, if the variable capacitor Cv of the correction circuit 20 is adjusted, and subsequently the measurement is performed by coupling the measured capacitor Cs to the signal line 50, an accurate measurement can be performed without being affected by the influence of the parasitic capacitor Cp. In addition, the impedance detection circuit according to this embodiment can perform not only detection of the capacitance but also detection of the resistance.

In the impedance detection circuit according to this embodiment explained above, the feedback resistor R2 is coupled between the output terminal and the inverting input terminal (−) of the operational amplifier AMP1 of the detection circuit 10, forming a closed loop. Moreover, the measured capacitor Cs and the parasitic capacitor Cp are coupled to the inverting input terminal (−) of the operational amplifier AMP1.

Here, the detection signal S7 of the operational amplifier AMP1 passes through the feedback resistor R2, and is supplied to the inverting input terminal (−) of the operational amplifier AMP1. Moreover, the measured capacitor Cs and the parasitic capacitor Cp are coupled to the inverting input terminal (−). Therefore, the signal inputted into the inverting input terminal (−) of the operational amplifier AMP1 is delayed in phase to an original signal inputted into the non-inverting input terminal (+) of the operational amplifier AMP1.

However, since the operational amplifier AMP1 forms the closed loop, the inverting input terminal (−) and non-inverting input terminal (+) of the operational amplifier AMP1 are in an imaginary short state. Therefore, the operational amplifier AMP1 operates so that the phase of the inverting input terminal (−) and the phase of the original signal may become the same. That is, by advancing a phase of the detection signal S7 of the operational amplifier AMP1 with respect to the phase of the original signal, it is possible to make the signal inputted into the inverting input terminal (−) of the operational amplifier AMP1 and the original signal inputted into the non-inverting input terminal (+) in the same phase.

On the other hand, when the measured capacitor Cs and the parasitic capacitor Cp are seen as impedance elements, an amplitude of the detection signal S7 outputted from the operational amplifier AMP1 increases according to a ratio of the impedance of the measured capacitor Cs and the parasitic capacitor Cp and the resistance of the feedback resistor R2. Therefore, due to the influence of the parasitic capacitor Cp, the detection signal S7 outputted from the operational amplifier AMP1 of the detection circuit 10 advances in phase to the original signal, and also increases in amplitude.

Therefore, in the impedance detection circuit according to this embodiment, the phase of the detection signal S7 of the operational amplifier AMP1 is delayed and the amplitude of the detection signal S7 is attenuated using the correction circuit 20. That is, the correction circuit 20 delays the phase of the detection signal S7 of the operational amplifier AMP1 by an amount of phase being advanced in accordance with a capacitance of the parasitic capacitor Cp produced in the signal line 50, and at the same time attenuates the amplitude of the detection signal S7 of the operational amplifier AMP1 by an amount of amplitude being increased in accordance with the capacitance of the parasitic capacitor Cp produced in the signal line 50.

Concretely, for the detection signal S7 outputted from the operational amplifier AMP1 of the detection circuit 10, the correction circuit 20 generates a signal whose phase is delayed and further whose amplitude is attenuated by respective amounts of the influence of the parasitic capacitor Cp using the resistor R3 and the variable capacitor Cv.

Then, by subtracting the negative feedback detection signal S5 outputted by the detection circuit 10 from the detection signal S6 after the correction outputted by the correction circuit 20 in the subtraction circuit 30, the output signal (voltage) VOUT depending on the capacitance of the measured capacitor Cs can be obtained.

As explained above, it is possible for the impedance detection circuit according to this embodiment to remove the influence of the parasitic capacitor and also to output a signal proportional to the electrostatic capacitance of the measured capacitor Cs by adjusting only the variable capacitor Cv of the correction circuit 20.

That is, in the impedance detection circuit disclosed in Japanese Unexamined Patent Application Publication No. 2002-350477, in order to remove the influence of the parasitic capacitor, variable resistances at two places need to be adjusted. In the impedance detection circuit disclosed in Japanese Unexamined Patent Application Publication No. 2002-350477, due to the influence of the parasitic capacitor, a phase of the signal inputted into the inverting input terminal of an operational amplifier 141 of the detection circuit 131 is delayed with respect to the signal (the original signal) inputted into the non-inverting input terminal of the operational amplifier 141 of the detection circuit 131. For this reason, the impedance detection circuit shown in FIG. 8 cancels the phase delay and removes the influence of the parasitic capacitor by generating a signal having an advanced phase to the signal (the original signal) inputted into the non-inverting input terminal and feeding back this signal to the inverting input terminal of the operational amplifier 141 of the detection circuit 131.

In the detection circuit 131, the phase delay arises in a range of 0° to 90° due to the influence of the parasitic capacitor. Therefore, in order to cancel the phase delay, it is necessary to generate a signal whose phase is advanced by 0° to 90°. However, actually, it is impossible to generate a signal whose phase is advanced. Here, the original signal inputted into the non-inverting input terminal of the operational amplifier 141 of the detection circuit 131 is an AC signal. Therefore, a signal whose phase is delayed by 270° to 360° is the same as a signal whose phase is advanced by 0° to 90°.

However, a single operational amplifier can generate only a signal with a phase delay of a range of 0° to 180°. Then, in order to generate a signal with a phase delay of a range of 270° to 360° with the impedance detection circuit shown in FIG. 8, the phase is delayed by a range of 90° to 180° with the operational amplifier 151 of a phase compensating circuit 132 and the output signal is inverted (the phase is delayed by) 180° with the operational amplifier 161 of an amplitude compensating circuit 133 to achieve the generation.

Moreover, since the generated phase delay depends on the magnitude of the parasitic capacitor, the impedance detection circuit 132 shown in FIG. 8 is configured to be capable of generating a signal of an arbitrary phase delay within a range of 0° to 180° using a variable resistor 154 so as to support an arbitrary magnitude of the parasitic capacitor. Incidentally, if resistance values of the resistor 152 and the resistor 153 used in the phase compensating circuit 132 are the same, the amplitude of the output signal of the phase compensating circuit 132 and the amplitude of the signal (the original signal) inputted into the inverting input terminal of the operational amplifier 151 are the same.

However, practically, the value of the resistor 152 and the value of the resistor 153 vary due to manufacture variation etc. That is, the amplitude of the output signal of the phase compensating circuit 132 is attenuated or amplified to the amplitude of the signal (the original signal) inputted into the inverting input terminal of the operational amplifier 151.

Then, the impedance detection circuit disclosed in Japanese Unexamined Patent Application Publication No. 2002-350477 is configured to be capable of adjusting the amplitude arbitrarily by adjusting the variable resistor 162 of the amplitude compensating circuit 133 so that a signal with its amplitude attenuated or amplified can be restored to its original state.

Thus, in the impedance detection circuit disclosed in Japanese Unexamined Patent Application Publication No. 2002-350477, variable resistors at two places need to be adjusted.

On the other hand, the impedance detection circuit according to this embodiment can output a signal that is proportional to the electrostatic capacitance of the measured capacitor Cs by adjusting only the variable capacitor Cv of the correction circuit 20. Therefore, according to the present invention, the impedance detection circuit capable of removing the influence of the parasitic capacitor by a simple adjustment and an impedance detection method can be provided.

Moreover, in the impedance detection circuit according to Japanese Unexamined Patent Application Publication No. 2002-350477, in order to remove the influence of the parasitic capacitor, total two operational amplifiers were used in the phase compensating circuit 132 and the amplitude compensating circuit 133. However, in the impedance detection circuit according to this embodiment, the correction circuit 20 for removing the influence of the parasitic capacitor can negate the use of the operational amplifiers; therefore, it can be composed of only resistors and capacitors.

Moreover, since the impedance detection circuit according to this embodiment does not use the operational amplifier for the correction circuit 20, power consumption can also be reduced. Furthermore, since the number of elements used in the correction circuit 20 is small, the correction circuit is cheaply manufacturable. In addition, since an adjustment place is a single place, a test cost at the time of product shipment can also be reduced, and an adjustment time can be shortened.

Second Embodiment

Figure 4:
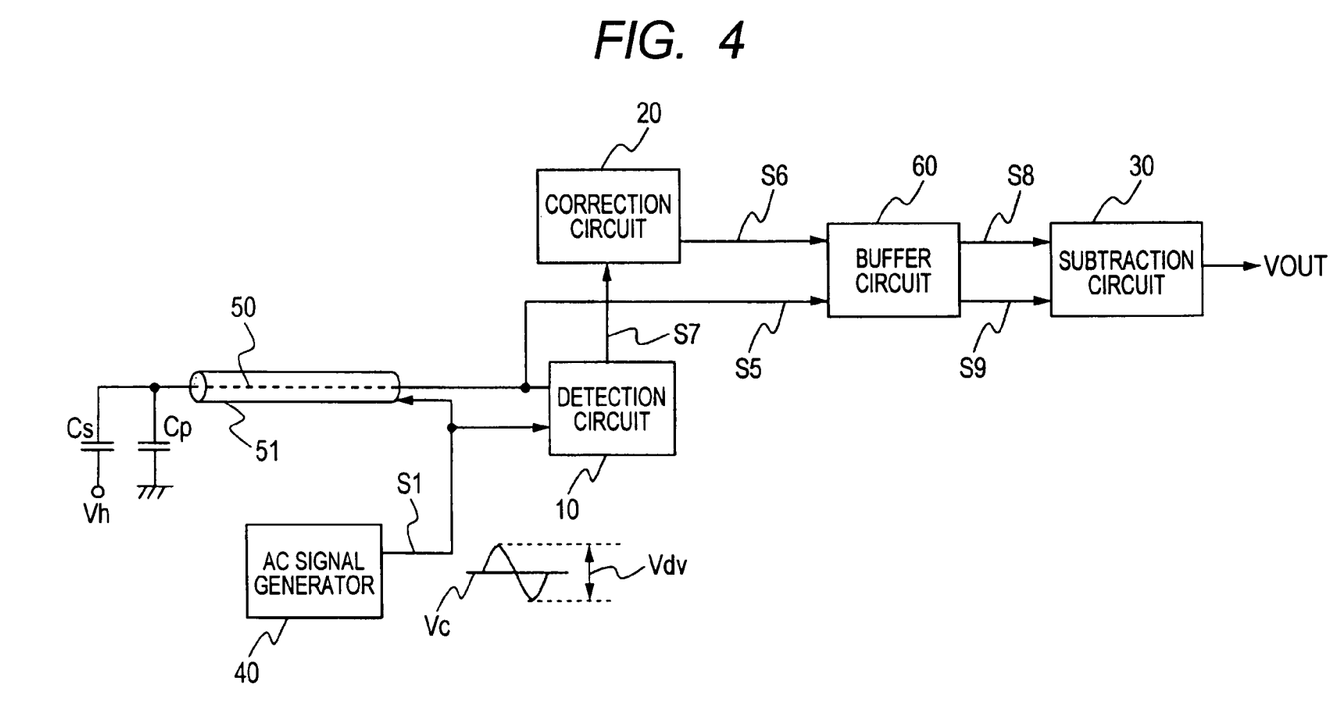
FIG. 4 is a block diagram showing an impedance detection circuit according to a second embodiment.

Next, a second embodiment of the present invention will be explained. FIG. 4 is a block diagram showing an impedance detection circuit (an impedance-voltage conversion circuit) according to this embodiment. The impedance detection circuit according to this embodiment differs from the impedance detection circuit according to the first embodiment in that the detection signal S6 after the correction outputted from the correction circuit 20 and the negative feedback detection signal S5 outputted from the detection circuit 10 are supplied to the subtraction circuit 30 through a buffer circuit 60. Since other respects than this are the same as those of the impedance detection circuit according to the first embodiment, overlapping explanations are omitted.

Figure 5:
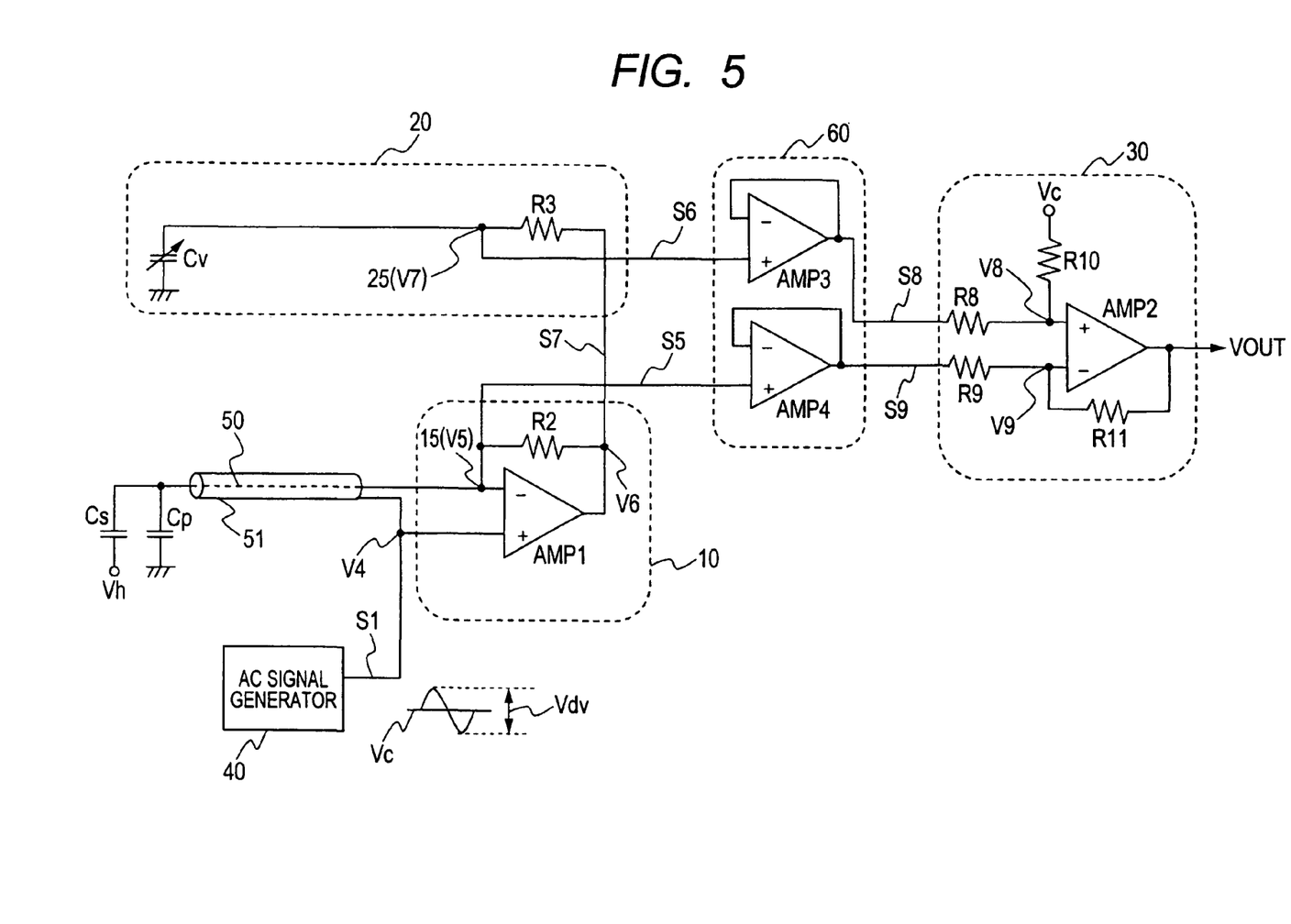
FIG. 5 is a circuit diagram showing the impedance detection circuit according to the second embodiment.

FIG. 5 is a circuit diagram showing the impedance detection circuit according to this embodiment. FIG. 5 shows a concrete circuit configuration of the buffer circuit 60 shown in FIG. 4. The buffer circuit 60 is composed including an operational amplifier AMP3 (a second operational amplifier) and an operational amplifier AMP4 (a third operational amplifier). The operational amplifier AMP3 and the operational amplifier AMP4 both take a so-called voltage follower configuration in which the output terminal and the inverting input terminal (−) are coupled.

The detection signal S6 after the correction outputted from the correction circuit 20 is supplied to a non-inverting input terminal (+) of the operational amplifier AMP3. Moreover, the output signal of the operational amplifier AMP3 becomes a correction detection signal S8 after the buffering, and is supplied to the subtraction circuit 30. The negative feedback detection signal S5 outputted from the detection circuit 10 is supplied to a non-inverting input terminal (+) of the operational amplifier AMP4. Moreover, the output signal of the operational amplifier AMP4 becomes a negative feedback detection signal S9 after the buffering, and is supplied to the subtraction circuit 30.

A reason of adding the buffer circuit 60 in the impedance detection circuit according to this embodiment is that there is a case where the amplitude of the output signal Vout may attenuate due to an influence of the resistors R8, R9 of the subtraction circuit 30 as shown by Equation (30) in the circuit configuration of the first embodiment. Therefore, it is possible to remove an influence of the resistors R8 to R11 of the subtraction circuit 30 by inserting the buffer circuit 60 before the subtraction circuit 30 like the impedance detection circuit according to this embodiment.

Next, the operation of the impedance detection circuit according to this embodiment will be explained. Also in this embodiment, the AC signal generator 40 generates and outputs the sinusoidal signal S1 that is an AC signal. The sinusoidal signal S1 outputted from the AC signal generator 40 is the synthetic signal of the AC signal component Vdv and the midpoint potential Vc of the AC signal amplitude. That is, the sinusoidal signal S1 is a signal whose AC signal component Vdv is vibrating at a DC voltage level of the midpoint potential Vc of the AC signal amplitude as a center. The impedance detection circuit according to this embodiment is incapable of detecting the capacitance because no charging/discharging currents flow in the measured capacitor Cs. Therefore, regarding the sinusoidal signal S1, only the AC signal component Vdv may be taken into consideration. Below, the operation of the impedance detection circuit will be explained denoting the angular frequency of the AC signal Vdv by ω.

In the detection circuit 10 of the impedance detection circuit shown in FIG. 5, since the output terminal and the inverting input terminal (−) of the operational amplifier AMP1 form a closed loop altogether through the feedback resistor R2, being closed therein, the inverting input terminal (−) and the non-inverting input terminal (+) of the operational amplifier AMP1 are in an imaginary short state. Therefore, the potential difference between the inverting input terminal (−) and the non-inverting input terminal (+) of the operational amplifier AMP1 becomes substantially zero, and the signal corresponding to the sinusoidal signal S1 from the AC signal generator 40 flows also in the signal line 50. Therefore, the AC signal component Vdv will be impressed to the measured capacitor Cs and the parasitic capacitor Cp. Denoting the synthetic impedance of the measured capacitor Cs and the parasitic capacitor Cp by Rsp, the synthetic impedance Rsp is expressed as Equation (27).

Then, denoting a current consumed by the measured capacitor Cs and the parasitic capacitor Cp by the current i1, the potential V5 of the node 15 is expressed by the following equation (31).

[Equation 31]

$$V5 = \frac{1}{j\omega Cp + j\omega Cs} \cdot i1 \qquad (31)$$

Expressing Equation (31) by an equation using the current i1, it becomes as the following equation (32).

[Equation 32]

$$i1 = (j\omega Cp + j\omega Cs) \cdot V5 \qquad (32)$$

Moreover, since the current i1 flows in the feedback resistor R2 and node potentials of both ends of the feedback resistor R2 are the node potential V6 and the node potential V5, the following equation (33) is realized from Ohm's law.

[Equation 33]

$$V6 - V5 = (j\omega Cp + j\omega Cs) \cdot V5 \cdot R2 \qquad (33)$$

Expressing Equation (33) by an equation of the node potential V6, it becomes as the following equation (34).

[Equation 34]

$$V6 = (j\omega CpR2 + j\omega CsR2 + 1) \cdot V5 \qquad (34)$$

Denoting the impedance of the variable capacitor Cv by Rv, the potential V7 of the node 25 can be expressed by the following equation (35).

[Equation 25]

$$V7 = V6 \cdot \frac{Rv}{Rv + R3} \qquad (35)$$

Moreover, the impedance Rv of the variable capacitor Cv can be expressed as Equation (28). Substituting Equation (28) and Equation (34) into Equation (35), the node potential V7 is expressed by the following equation (36).

[Equation 36]

$$V7 = \frac{1}{1 + j\omega CvR3} \cdot (j\omega CsR2 + j\omega CpR2 + 1) \cdot V5 \qquad (36)$$

The output signal (voltage) VOUT of the actual subtraction circuit 30 is represented by a value obtained by subtracting the node potential V5 from the node potential V7 and adding the midpoint potential Vc of the AC signal amplitude to it. However, since regarding the DC component, the capacitance is not convertible to a voltage, if the DC component is disregarded, the output signal (voltage) VOUT will become a value obtained by subtracting the node potential V5 from the node potential V7. Therefore, the output signal (voltage) VOUT is expressed by the following equation (37).

[Equation 37]

$$VOUT = \frac{j\omega CsR2}{1+j\omega CvR3} \cdot V5 + \boxed{\frac{1+j\omega CpR2}{1+j\omega CvR3}} \cdot V5 - V5 \quad (37)$$

Here, focusing attention on a portion of Equation (37) surrounded by dotted lines, if the resistor R2 and the resistor R3 are made to have the same value, the variable capacitor Cv is adjusted to the same value as the parasitic capacitor Cp, and the node potential V5 is replaced by the AC signal component Vdv, the output signal (voltage) VOUT can be expressed by the following equation (38).

[Equation 38]

$$VOUT = \frac{j\omega CsR2}{1+j\omega CpR2} \cdot Vdv \quad (38)$$

Comparison of Equation (38) and Equation (30) explained in the first embodiment shows that a denominator of the former is smaller than that of the latter by R2/R8. Therefore, in this embodiment, the amplitude of the output signal (voltage) VOUT becomes large compared with the case of the first embodiment. Moreover, as can also be understood from Equation (38), the influence of the resistors R8 to R11 of the subtraction circuit 30 can be removed by inserting the buffer circuit 60 before the subtraction circuit 30.

Also in this embodiment, since a term containing the parasitic capacitor Cp is included in the denominator, the output signal Vout is affected by the influence of the parasitic capacitor Cp. However, since when the measured capacitor Cs is large, the output signal Vout is proportional to the measured capacitor Cs, the impedance detection circuit according to this embodiment also becomes an impedance detection circuit capable of obtaining a voltage proportional to the measured capacitor that is the object of the present invention.

As explained above, in the impedance detection circuit according to this embodiment, the detection signal S6 after the correction outputted from the correction circuit 20 and the negative feedback detection signal S5 outputted from the detection circuit 10 are supplied to the subtraction circuit 30 through the buffer circuit 60. Thereby, it is possible to enlarge the amplitude of the output signal (voltage) VOUT compared with the case of the first embodiment. Therefore, even in the case where the capacitance of the measured capacitor is small, a level of the output signal (voltage) VOUT can be enlarged; therefore, it is possible to detect the capacitance of the measured capacitor more correctly. Moreover, the influence of the resistors R8 to R11 of the subtraction circuit 30 can be removed by inserting the buffer circuit 60 before the subtraction circuit 30.

Third Embodiment

Figure 6:
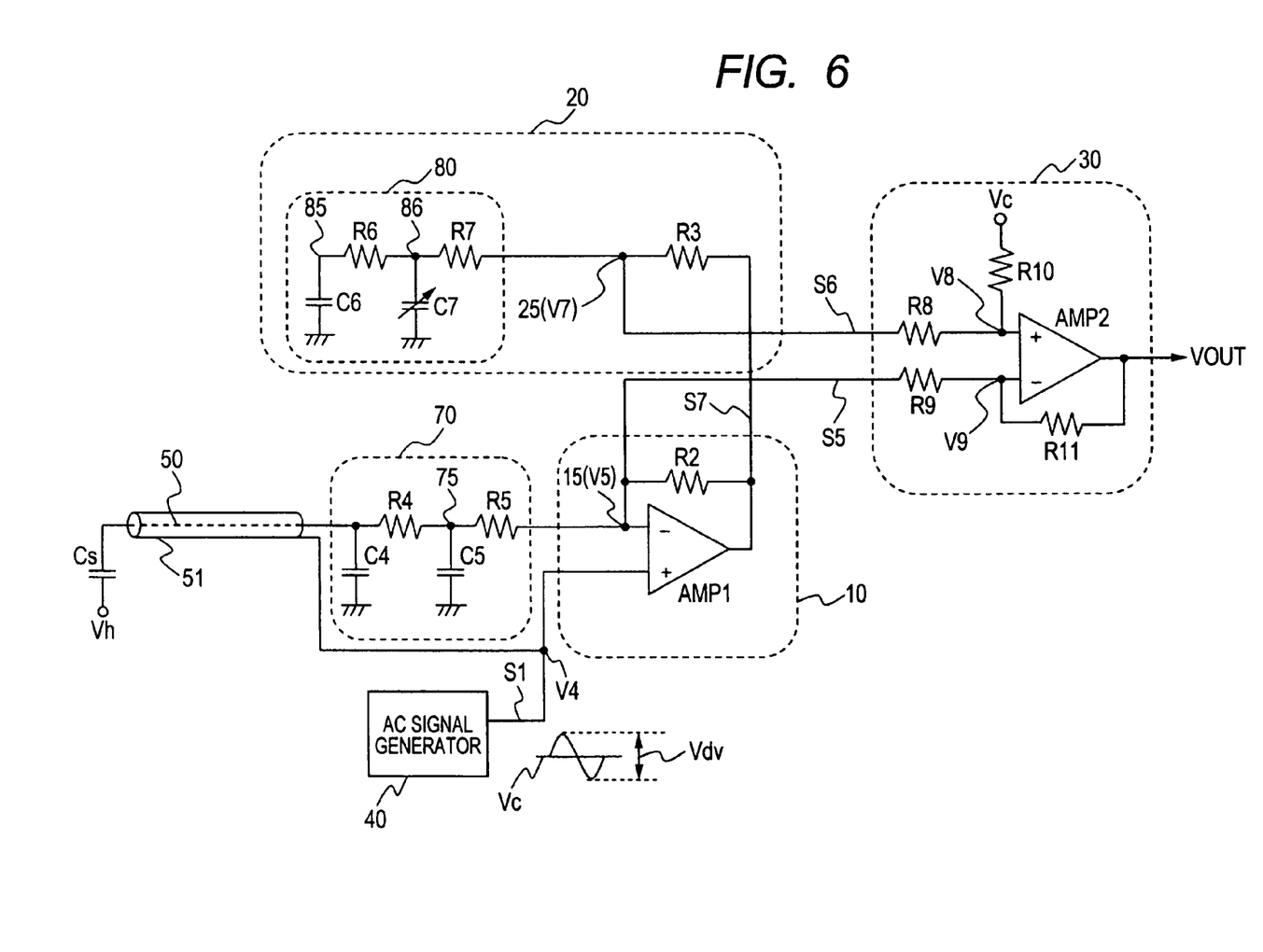
FIG. 6 is a circuit diagram showing an impedance detection circuit according to a third embodiment.

Next, a third embodiment of the present invention will be explained. FIG. 6 is a block diagram showing an impedance detection circuit (impedance-voltage conversion circuit) according to this embodiment. The impedance detection circuit according to this embodiment differs from the impedance detection circuit according to the first embodiment in that the influence of the noises from the outside that the signal line receives is removed by inserting a filter circuit 70 between the node 15 of the detection circuit 10 and the measured capacitor Cs and that a filter circuit for correction 8 coupled with the node 25 of the correction circuit 20 is provided. Since other respects than this are the same as those of the impedance detection circuit according to the first embodiment, overlapping explanations are omitted.

Generally, measurement environments in which the measured capacitor Cs is measured are various, and even in an environment in which the measurement is affected by the influence of the noises from the outside, the measured capacitor Cs must be measured correctly. In this embodiment, the impedance detection circuit capable of measuring the measured capacitor Cs even in the case where the influence of the noises from the outside exists will be explained.

The filter circuit 70 is composed including a capacitor C4 (a first capacitor), a capacitor C5 (a second capacitor), a resistor R4 (a second resistor), and a resistor R5 (a third resistor). One end of the capacitor C4 is coupled with one end of the measured capacitor Cs and one end of the resistor R4 and an other end thereof is coupled to the earth potential. One end of the resistor R4 is coupled with the one end of the measured capacitor Cs and the one end of the capacitor C4, and an other end thereof is coupled with one end of the capacitor C5 and one end of the resistor R5 (a second node 75). The one end of the capacitor C5 is coupled with the other end of the resistor R4 and the one end of the resistor R5 (the node 75) and an other end thereof is coupled to the earth potential. The one end of the resistor R5 is coupled with the other end of the resistor R4 and the one end of the capacitor C5 (the node 75) and an other end thereof is coupled with the node 15.

A filter circuit 80 is formed including a capacitor C6 (a third capacitor), a variable capacitor C7, a resistor R6 (a fourth resistor), and a resistor R7 (a fifth resistor). One end of the capacitor C6 is coupled with one end of the resistor R6 (a third node 85), and an other end thereof is coupled to the earth potential. The one end of the resistor R6 is coupled with the one end of the capacitor C6 (the node 85) and an other end thereof is coupled with one end of the variable capacitor C7 and one end of the resistor R7 (a fourth node 86). The one end of the variable capacitor C7 is coupled with the other end of the resistor R6 and the one end of the resistor R7 (the node 86) and an other end of thereof is coupled to the earth potential. The one end of the resistor R7 is coupled with the other end of the resistor R6 and the one end of the variable capacitor C7 (the node 86) and an other end thereof is coupled with the node 25.

In the impedance detection circuit according to this embodiment, it is assumed that the parasitic capacitor Cp is so small that it may be ignored, so that it is not affected by the influence of the parasitic capacitor Cp.

Also in the impedance detection circuit according to this embodiment, an electrode for measuring the measured capacitor Cs and a portion of the signal line 50 that is not covered with the shielding wire 51 are prone to be affected by the influence of the noises. Therefore, in order to measure the capacitance of the measured capacitor Cs correctly even in the measurement environment where the impedance detection circuit is affected by the influence of the noises from the outside, there is a case where the filter circuit 70 is inserted between the inverting input terminal (−) of the operational amplifier AMP1 of the detection circuit 10 and the measured capacitor Cs and the measurement is performed.

However, if the filter circuit 70 is inserted, the impedance of the filter circuit 70 will also be added to the measured capacitor Cs, and will be measured together. Therefore, in the impedance detection circuit according to this embodiment, the influence of the impedance of the filter circuit 70 is removed by coupling the filter circuit for correction 80 of the same configuration as the filter circuit 70 to the node 25 of the correction circuit 20.

Incidentally, operations etc. of the impedance detection circuit according to this embodiment can be explained by replacing the synthetic impedance of the filter circuit 70 with the impedance of the parasitic capacitor Cp in the first embodiment; therefore, overlapping explanations are omitted. That is, also in the impedance detection circuit according to this embodiment, it is possible to correct the detection signal S7 outputted from the operational amplifier AMP1 by adjusting the variable capacitor C7.

It is possible for the impedance detection circuit according to this embodiment to remove not only the influence of the parasitic capacitor Cp but also influences of a filter circuit that was inserted intentionally to remove the noises from the outside and the like (namely, all impedance components that are added to the signal line 50 except that to be detected) by using the correction circuit 20. Incidentally, also in this embodiment, the same effect as that of the impedance detection circuit explained in the first embodiment can be attained.

Fourth Embodiment

Figure 7:
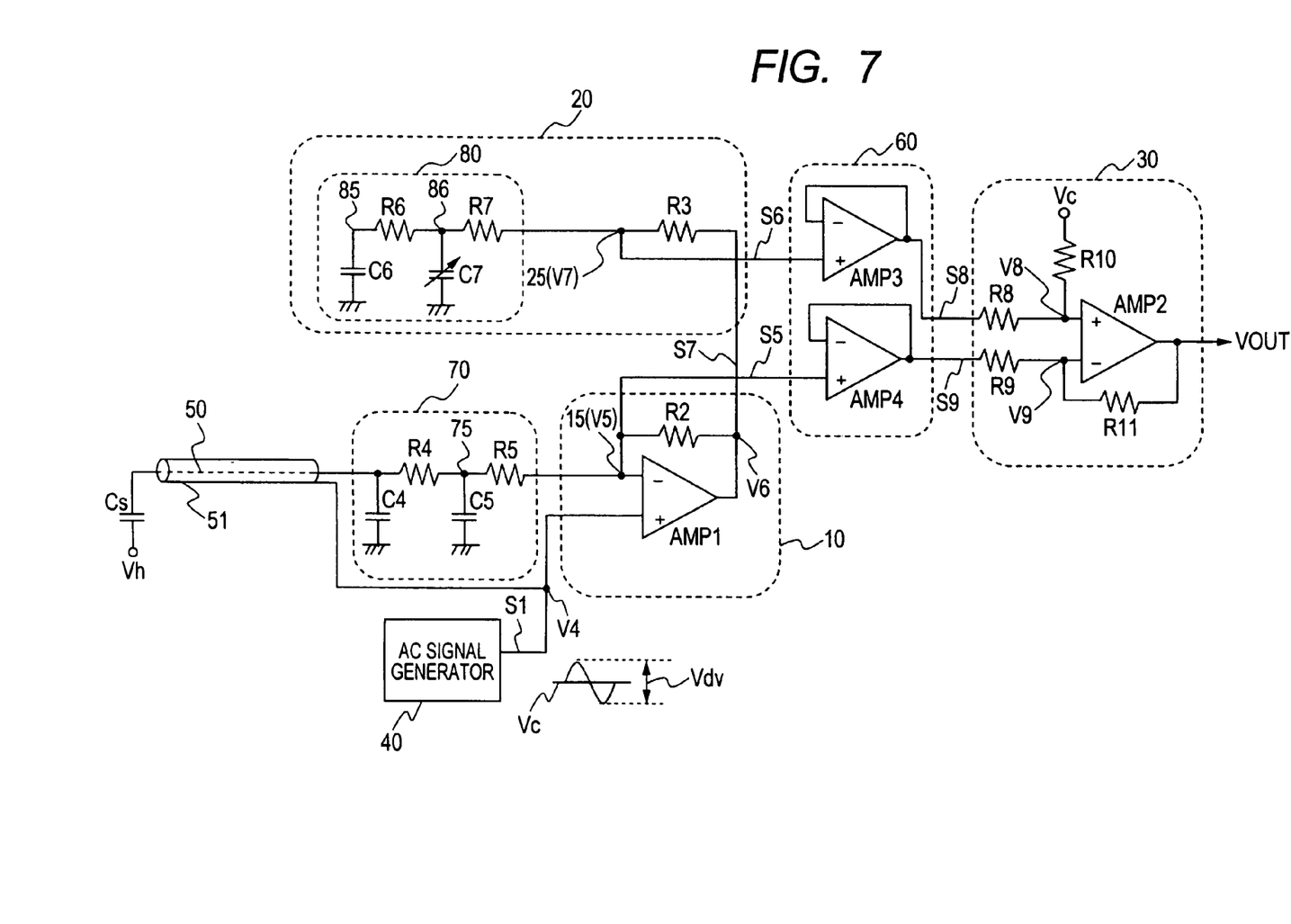
FIG. 7 is a circuit diagram showing an impedance detection circuit according to a fourth embodiment.

Next, a fourth embodiment of the present invention will be explained. FIG. 7 is a block diagram showing an impedance detection circuit (impedance-voltage conversion circuit) according to this embodiment. The impedance detection circuit according to this embodiment differs from the impedance detection circuit according to the first embodiment in the following respects: the detection signal S6 after the correction outputted from the correction circuit 20 and the negative feedback detection signal S5 outputted from the detection circuit 10 are supplied to the subtraction circuit 30 through the buffer circuit 60; the influence of the noises from the outside that the signal line receives is removed by inserting the filter circuit 70 between the node 15 of the detection circuit 10 and the measured capacitor Cs; and the filter circuit for correction 8 coupled with the node 25 of the correction circuit 20 is provided.

That is, the impedance detection circuit according to this embodiment has a configuration where the impedance detection circuit according to the second embodiment and the impedance detection circuit according to the third embodiment are combined. Since components, operations, effects, etc. according to this embodiment are the same as those of the impedance detection circuit according to the first to third embodiments, overlapping explanations are omitted.

As mentioned above, although the present invention was explained based on the above-mentioned embodiments, the present invention is not limited to the configurations of the above-mentioned embodiments, but naturally includes various modifications, corrections, and combinations that can be made by a person skilled in the art within scopes of the invention described in "what is claimed is" of the present patent application.

What is claimed is:

1. An impedance detection circuit, comprising:
an AC signal generator that generates an AC signal;
a detection circuit that includes a first operational amplifier having an inverting input terminal coupled to one end of a signal line to whose other end a measured capacitor is coupled, a non-inverting input terminal coupled with a shielding wire covering at least a part of the signal line and an output terminal of the AC signal generator, and an output terminal, and a first feedback resistor coupled between the output terminal and the inverting input terminal of the first operational amplifier;
a correction circuit that includes a first resistor whose one end is coupled with the output terminal of the first operational amplifier and whose other end is coupled with a first node and a variable capacitor whose one end is electrically coupled with the first node, and that corrects a detection signal outputted from the first operational amplifier by adjusting a capacitance of the variable capacitor and outputs the detection signal after the correction from the first node; and
a subtraction circuit that subtracts a signal inputted into the inverting input terminal of the first operational amplifier from the detection signal after the correction outputted from the correction circuit to output an output voltage based on a capacitance of the measured capacitor.

2. The impedance detection circuit according to claim 1, wherein the correction circuit delays a phase of the detection signal outputted from the first operational amplifier and attenuates an amplitude of the detection signal.

3. The impedance detection circuit according to claim 1, wherein the correction circuit delays a phase of the detection signal outputted from the first operational amplifier by an amount of phase being advanced in accordance with a capacitance of a parasitic capacitor produced in the signal line, and attenuates an amplitude of the detection signal outputted from the first operational amplifier by an amount of amplitude being increased in accordance with the capacitance of the parasitic capacitor produced in the signal line.

4. The impedance detection circuit according to claim 1, wherein the subtraction circuit inputs therein the signal inputted into the inverting input terminal of the first operational amplifier and the detection signal after the correction outputted from the correction circuit through a buffer circuit.

5. The impedance detection circuit according to claim 4, wherein the buffer circuit includes:
a second operational amplifier of a voltage follower configuration into whose non-inverting input terminal the detection signal after the correction outputted from the correction circuit is inputted and whose output terminal and inverting input terminal are coupled; and
a third operational amplifier of a voltage follower configuration into whose non-inverting input terminal the signal inputted into the inverting input terminal of the first operational amplifier is inputted and whose output terminal and inverting input terminal are coupled.

6. The impedance detection circuit according to claim 1, wherein a resistance of the first feedback resistor of the detection circuit and a resistance of the first resistor of the correction circuit are the same, and the capacitance of the variable capacitor and a capacitance of a parasitic capacitor produced in the signal line are the same.

7. The impedance detection circuit according to claim 1, further comprising:

a first filter circuit between the inverting input terminal of the first operational amplifier and the signal line, wherein the correction circuit has a second filter circuit that is coupled to the first node, includes the variable capacitor, and has the same characteristic as the first filter circuit.

8. The impedance detection circuit according to claim 7, wherein the first filter circuit includes:

a second resistor whose one end is coupled to an other end of the signal line and whose other end is coupled to a second node;

a first capacitative element whose one end is coupled to the one end of the second resistor and whose other end is coupled with an earth potential;

a third resistor whose one end is coupled to the second node and whose other end is coupled to the inverting input terminal of the first operational amplifier; and a second capacitative element whose one end is coupled to the second node and whose other end is coupled with the earth potential, and wherein the second filter circuit includes:

a fourth resistor whose one end is coupled to a third node and whose other end is coupled to a fourth node;

a third capacitative element whose one end is coupled with the third node and whose other end is coupled with the earth potential;

a fifth resistor whose one end is coupled to the fourth node and whose other end is coupled to the first node; and the variable capacitor whose one end is coupled to the fourth node and whose other end is coupled with the earth potential.

9. The impedance detection circuit according to claim 1, wherein the subtraction circuit includes:

a fourth operational amplifier;

a second feedback resistor coupled between an output terminal and an inverting input terminal of the fourth operational amplifier;

a sixth resistor whose one end is coupled with a non-inverting input terminal of the fourth operational amplifier and to whose other end the detection signal after the correction is supplied;

a seventh resistor whose one end is coupled with the inverting input terminal of the fourth operational amplifier and to whose other end the signal inputted into the inverting input terminal of the first operational amplifier is supplied; and an eighth resistor coupled between the non-inverting input terminal of the fourth operational amplifier and a potential same as a midpoint potential of the AC signal.

10. An impedance detection method for detecting an impedance of a measured capacitor using an impedance detection circuit, the impedance detection circuit including:

an AC signal generator that generates an AC signal;

a detection circuit that has a first operational amplifier having an inverting input terminal coupled with one end of a signal line to whose other end the measured capacitor is coupled, a non-inverting input terminal coupled to a shielding wire covering at least a part of the signal line and an output terminal of the AC signal generator, and an output terminal, and a first feedback resistor coupled between the output terminal and the inverting input terminal of the first operational amplifier;

a correction circuit having a first resistor whose one end is coupled with the output terminal of the first operational amplifier and whose other end is coupled with a first node and a variable capacitor whose one end is electrically coupled with the first node, and that outputs the detection signal after the correction from the first node; and a subtraction circuit for subtracting a signal inputted into the inverting input terminal of the first operational amplifier from the detection signal after the correction outputted from the correction circuit;

wherein a phase of the detection signal outputted from the first operational amplifier is delayed and an amplitude of the detection signal is attenuated by adjusting a capacitance of the variable capacitor of the correction circuit.

11. The impedance detection method according to claim 10, wherein prior to measuring the impedance of the measured capacitor, in a state where the measured capacitor is not coupled to the one end of the signal line, the variable capacitor is adjusted so that a potential of the first node and a potential of the inverting input terminal of the first operational amplifier may be equalized.

12. The impedance detection method according to claim 11, wherein the variable capacitor is adjusted so that the output signal of the subtraction circuit may not contain an AC component.

* * * * *